(12) United States Patent
Liu et al.

(10) Patent No.: US 9,443,899 B1
(45) Date of Patent: Sep. 13, 2016

(54) BSI CMOS IMAGE SENSOR WITH IMPROVED PHASE DETECTING PIXEL

(71) Applicant: OmniVision Technologies, Inc., Santa Clara, CA (US)

(72) Inventors: Chia-Ying Liu, Hsinchu (TW); Chin-Poh Pang, Pleasanton, CA (US); Chih-Wei Hsiung, San Jose, CA (US); Vincent Venezia, Los Gatos, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 14/932,472

(22) Filed: Nov. 4, 2015

(51) Int. Cl.
*H01L 27/146* (2006.01)
*H04N 5/369* (2011.01)

(52) U.S. Cl.
CPC ..... *H01L 27/14643* (2013.01); *H01L 27/1463* (2013.01); *H01L 27/1464* (2013.01); *H01L 27/14609* (2013.01); *H01L 27/14621* (2013.01); *H01L 27/14683* (2013.01); *H01L 27/14685* (2013.01); *H04N 5/3696* (2013.01)

(58) Field of Classification Search
CPC .......... H01L 27/14643; H01L 27/14609; H01L 27/14621; H01L 27/1463; H01L 27/1464; H01L 27/14683; H01L 27/14685; H01L 5/3696
USPC .......................................................... 257/432
See application file for complete search history.

(56) References Cited

U.S. PATENT DOCUMENTS

| | | | |
|---|---|---|---|
| 2013/0088621 A1 | 4/2013 | Hamada | |
| 2015/0041627 A1 | 2/2015 | Webster | |
| 2015/0048427 A1 | 2/2015 | Hu et al. | |
| 2015/0228684 A1* | 8/2015 | Yamashita | H01L 27/14643 257/292 |
| 2015/0312461 A1* | 10/2015 | Kim | H01L 27/14609 348/308 |

* cited by examiner

*Primary Examiner* — Yasser A Abdelaziez
(74) *Attorney, Agent, or Firm* — Lathrop & Gage LLP

(57) ABSTRACT

An improved back side illuminated (BSI) complementary metal oxide semiconductor (CMOS) image sensor, and associated methods, improve phase detecting capability. The BSI CMOS image sensor has an array of pixels that include a phase detecting pixel (PDP), a composite grid formed of a buried color filter array and composite metal/oxide grid, and a photodiode implant corresponding to the PDP. A PDP mask is fabricated with a deep trench isolation (DTI) structure proximate the PDP and positioned to mask at least part of the photodiode implant such that the PDP mask is positioned between the composite grid and the photodiode implant.

12 Claims, 6 Drawing Sheets

“BSI CMOS IMAGE SENSOR WITH IMPROVED PHASE DETECTING PIXEL”

BACKGROUND

Phase Detecting Pixels (PDPs) on a back side illuminated (BSI) complementary metal oxide semiconductor (CMOS) image sensor are useful for improving focus in a camera. Pairs of pixels are masked such that they detect light only from one or other edge of an objective lens. A pair of complimentary PDPs is positioned on the sensor to allow the camera to determine how out-of-phase received light is at that position, and thereby determine lens focusing adjustments needed to focus the image on the sensor.

Conventional manufacturing of a BSI CMOS image sensor with PDPs forms PDP masks for each PDP when forming a metal grid of a composite grid (oxide over metal) layer that also includes a buried color filter array (BCFA). Thus, the PDP masks are also positioned within the composite grid.

A BSI CMOS image sensor manufactured using a composite grid may obtain a higher quantum efficiency (QE), as compared with a BSI CMOS image sensor manufactured with a BCFA; however, phase detection ability is degraded because of the additional oxide above the PDP mask.

SUMMARY OF THE INVENTION

In one embodiment, a back side illuminated (BSI) complementary metal oxide semiconductor (CMOS) image sensor has an array of pixels that include a phase detecting pixel (PDP), a composite grid formed of a buried color filter array and composite metal/oxide grid, and a photodiode implant corresponding to the PDP. A PDP mask is fabricated concurrently with a deep trench isolation (DTI) structure proximate the PDP and positioned to mask at least part of the photodiode implant, such that the PDP mask is fabricated of the same material as the DTI structure and positioned between the composite grid and the photodiode implant.

In another embodiment, a method manufactures a back side illuminated (BSI) complementary metal oxide semiconductor (CMOS) image sensor of the type having an array of pixels that include a phase detecting pixel (PDP). A PDP mask for the PDP is fabricated in conjunction with a deep trench isolation (DTI) structure proximate the PDP and formed of the same continuous material. The PDP mask is positioned entirely between (a) a composite grid having a buried color filter array and composite metal/oxide grid and (b) a photodiode implant corresponding to the PDP.

In another embodiment, a method improves phase detection capability of a phase detecting pixel (PDP) in a back side illuminated (BSI) complementary metal oxide semiconductor (CMOS) image sensor. A PDP mask of the PDP is fabricated concurrently with, and of the same material as, deep trench insulation structures of the BSI CMOS image sensor such that the PDP mask is positioned between a composite grid and a photodiode implant of the BSI CMOS image sensor. The position of the PDP mask improves the quantum efficiency (QE) and sensitivity of the PDP.

DETAILED DESCRIPTION OF THE EMBODIMENTS

Figure 1:
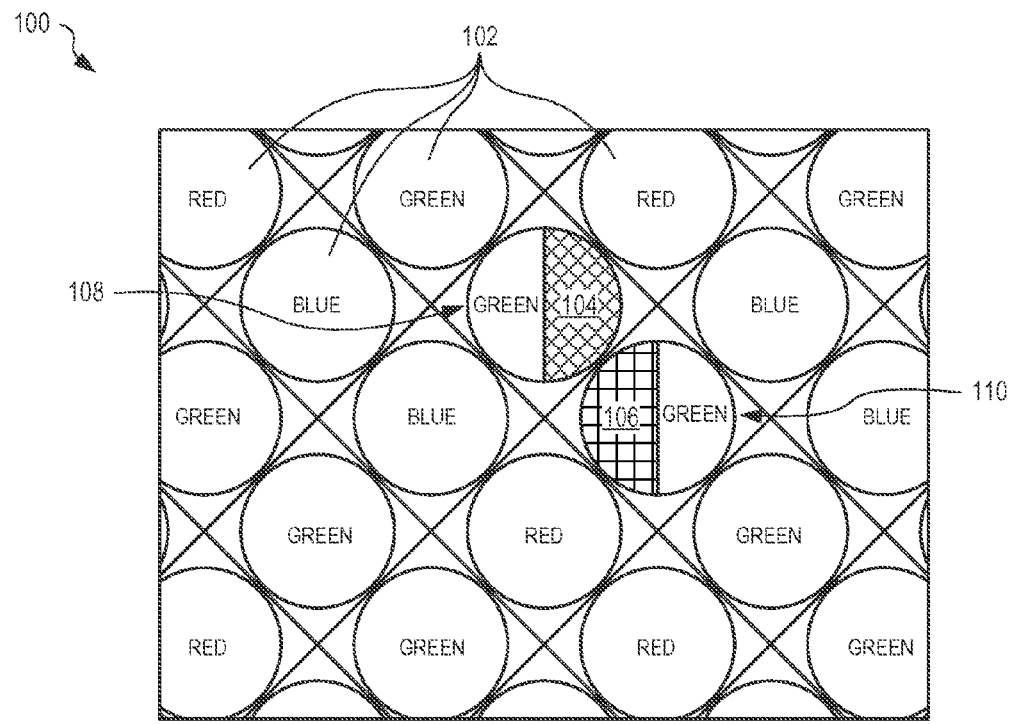
FIG. 1 shows a pixel pattern of a back side illuminated (BSI) complementary metal oxide semiconductor (CMOS) image sensor with phase detection pixels (PDP).
Figure 2:
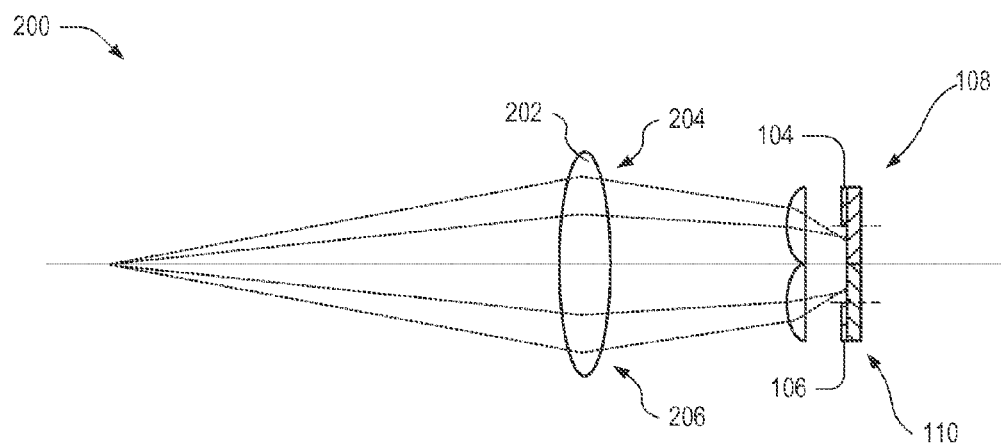
FIG. 2 is a schematic illustrating exemplary operation of the PDPs of FIG. 1 to detect light from different sides of an objective lens.

FIG. 1 shows a pixel pattern of a back side illuminated (BSI) complementary metal oxide semiconductor (CMOS) image sensor 100 with a plurality of pixels 102, each having a colored filter and a lens, where two pixels are configured with a right phase detection pixel (PDP) mask 104 and a left PDP mask 106 to operate as PDP 108 and 110, respectively. FIG. 2 is a schematic illustrating exemplary operation of PDPs 108 of FIG. 1 to detect light from a first side 204 of an objective lens 202, and of PDPs 110 to detect light from a second side 206 of objective lens 202. Phase detection pixels 108, 110 may be used within a camera to improve automatic focusing by detecting differences in phase for a focal point of an object being captured. The camera adjusts focus to align the detected phases from both PDPs 108 and 110.

Figure 3:
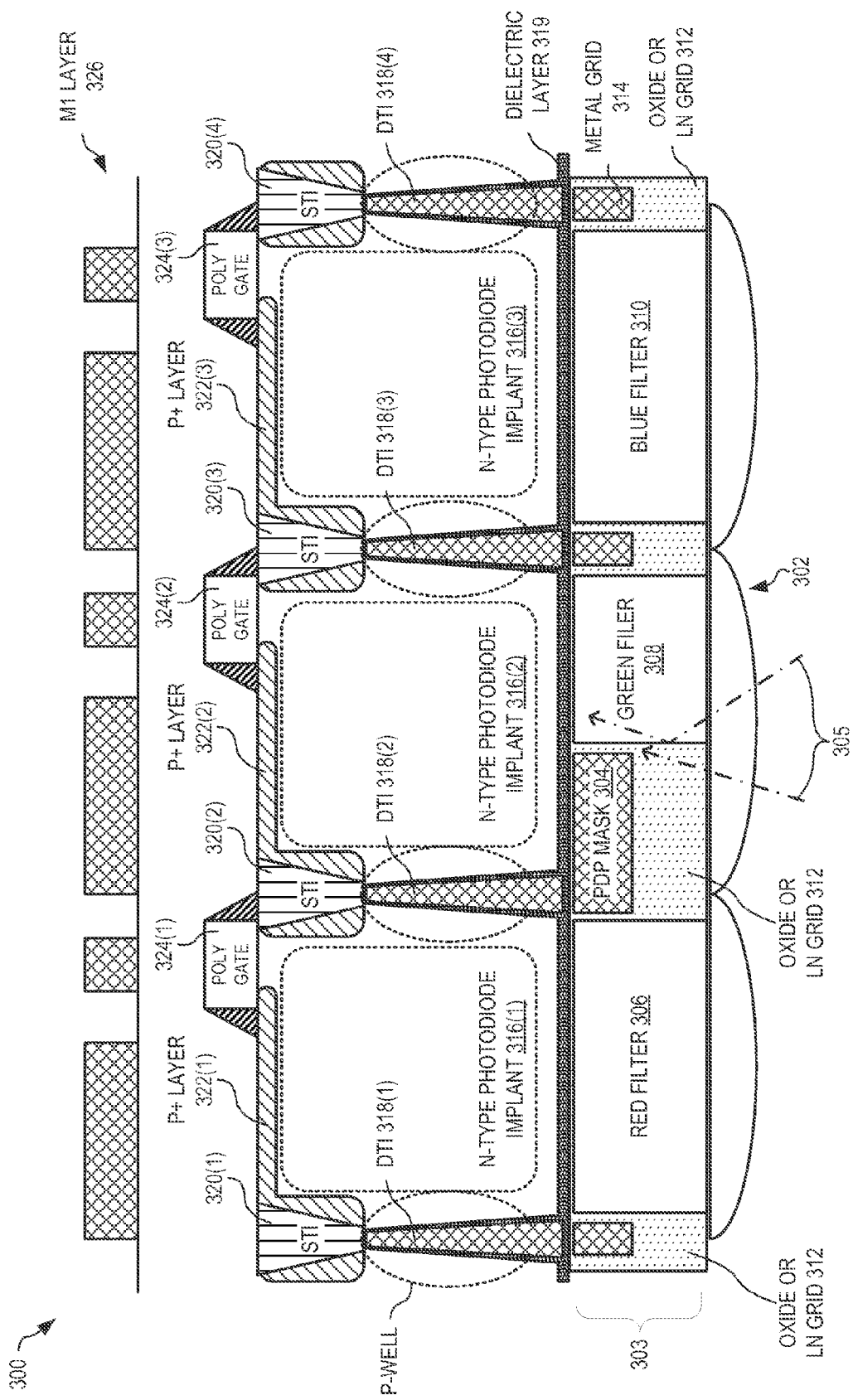
FIG. 3 is a cross-section of a portion of a prior art BSI CMOS image sensor illustrating exemplary construction of a prior art PDP.

FIG. 3 is a cross-section of a portion of a prior art BSI CMOS image sensor 300 illustrating construction of a prior art PDP 302. BSI CMOS image sensor 300 is formed with a composite grid 303 that includes a buried color filter array (BCFA), shown as a red filter 306, a green filter 308 and a blue filter 310, that is combined with a metal grid 314 and a PDP mask 304 and an oxide (or lanthanide (LN)) grid 312. BSI CMOS image sensor 300 is also shown with N-type photodiode implants 316(1)-(3), deep trench isolation (DTI) structures 318(1)-(4), shallow trench isolation (STI) structures 320(1)-(4), poly gates 324(1)-(4), a dielectric layer 319, P+ layers 322(1)-(3), and a metal 1 layer 326. In the prior art, the DTI structures 318 are typically fabricated from an oxide and/or an undoped polysilicon material.

Red filter 306 and blue filter 310 are similarly sized. However, green filter 308 is smaller because of PDP mask 304. This introduces a problem, illustrated by light rays 305, where oxide or LN grid 312 interferes with light entering at certain angles, and forms a reflective interface with an edge of green filter 308. Light entering at certain other angles may also pass through a reduced thickness of filter, reducing color selectivity. Further, since green filter 308 of PDP 302 is smaller than other green filters of BSI CMOS image sensor 300, fabrication of composite grid 303 is complex.

Figure 4:
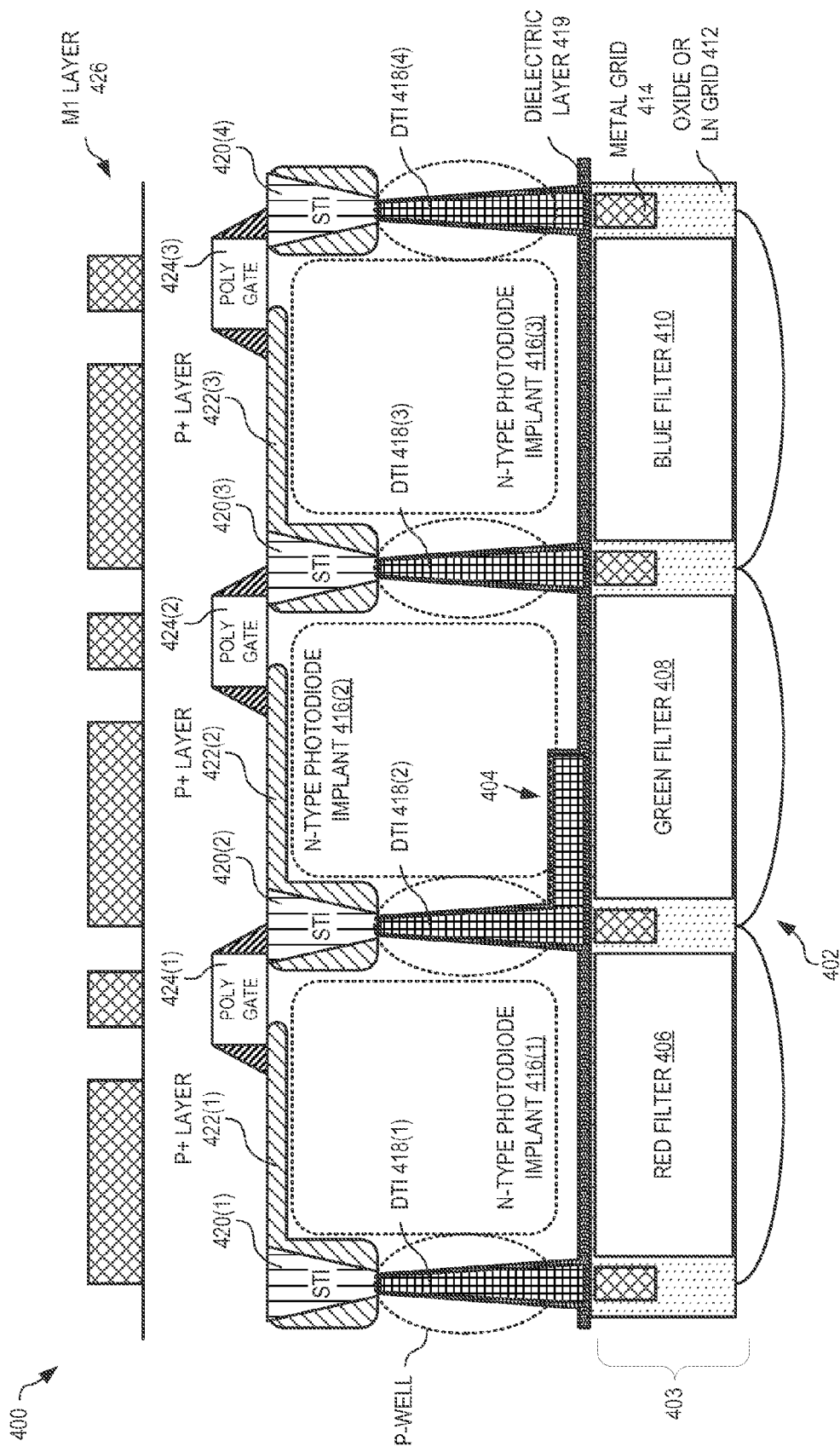
FIG. 4 shows one exemplary BSI CMOS image sensor that combines a PDP mask with a buried tungsten (W) DTI structure to improve pixel quantum efficiency and PDP sensitivity, in an embodiment.

FIG. 4 shows one exemplary BSI CMOS image sensor 400 that combines a PDP mask 404 with a buried tungsten (W) DTI structure 418(2) to improve pixel quantum efficiency (QE) and PDP sensitivity. BSI CMOS image sensor 400 is otherwise similar to BSI CMOS image sensor 300 of FIG. 3, and is formed with a composite grid 403 that includes a buried color filter array (BCFA), shown as a red filter 406, a green filter 408 and a blue filter 410, that is combined with a metal grid 414 and an oxide (or LN) grid 412. BSI CMOS image sensor 400 is also shown with N-type photodiode implants 416(1)-(3), deep trench isolation (DTI) structures 418(1)-(4), shallow trench isolation (STI) structures 420(1)-(4), poly gates 424(1)-(4), a dielectric layer 419, P+ layers 422(1)-(3), and a metal 1 layer 426.

In BSI CMOS image sensor 400, pixel quantum efficiency (QE) and PDP sensitivity are improved because PDP mask 404 is not included within composite grid 403 and therefore does not interfere with light interacting with side edges of the composite grid components for the pixel's light entrance area. Since filters 406, 408, and 420 are the same size, fabrication of the BCFA is easier as compared to BSI CMOS image sensor 300 of FIG. 3.

As shown in FIG. 4, PDP mask 404 is formed concurrently with DTI structures 418 during fabrication of BSI CMOS image sensor 400, such that DTI structure 418(2) and PDP mask 404 are continuous. DTI 418, and thus PDP 404, may be formed of tungsten (W) or other metals. In the prior art, fabrication of PDP mask 304 occurs during fabrication of metal grid 314.

Figure 5:
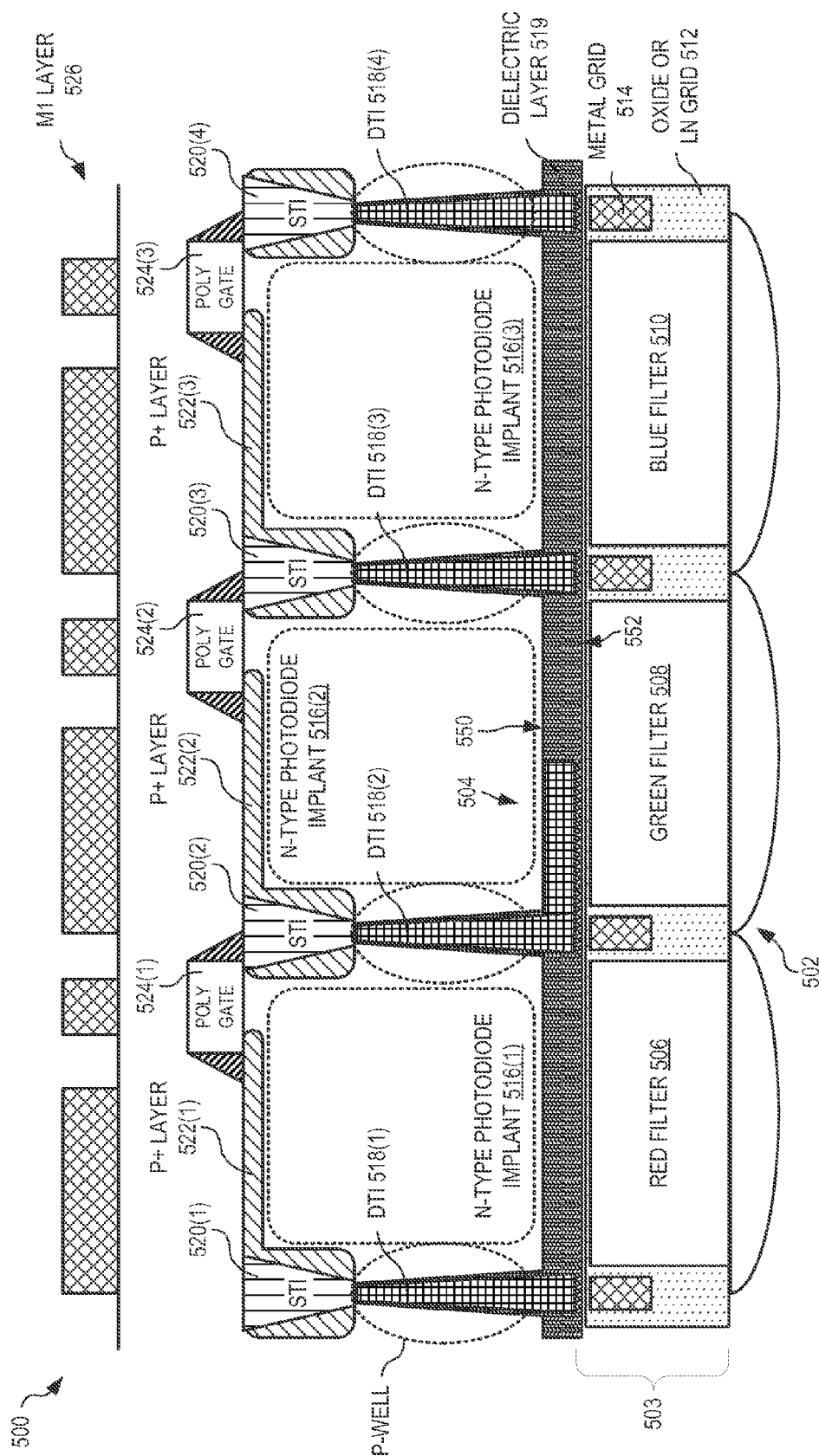
FIG. 5 shows one exemplary BSI CMOS image sensor that combines a PDP mask with a buried tungsten (W) DTI structure such that the PDP mask is positioned within a substantially flat dielectric layer of the image sensor.

FIG. 5 shows one exemplary BSI CMOS image sensor 500 that is similar to BSI CMOS image sensor 400 of FIG. 4, combining a PDP mask 504 with a buried tungsten (W) DTI structure 518(2), such that the PDP mask 504 is positioned within a substantially flat dielectric layer 519. BSI CMOS image sensor 500 is otherwise similar to BSI CMOS image sensor 400 of FIG. 4, and is formed with a composite grid 503 that includes a buried color filter array (BCFA), shown as a red filter 506, a green filter 508 and a blue filter 510, that is combined with a metal grid 514 and an oxide (or LN) grid 512. BSI CMOS image sensor 500 is also shown with N-type photodiode implants 516(1)-(3), deep trench isolation (DTI) structures 518(1)-(4), shallow trench isolation (STI) structures 520(1)-(4), poly gates 524(1)-(4), a dielectric layer 519, P+ layers 522(1)-(3), and a metal 1 layer 526.

As shown in FIG. 5, PDP mask 504 is formed concurrently with DTI structures 518 during fabrication of BSI CMOS image sensor 500, such that DTI structure 518(2) and PDP mask 504 are continuous. DTI 518, and thus PDP 504, may be formed of tungsten (W) or other metals.

In BSI CMOS image sensor 500, pixel quantum efficiency (QE) and PDP sensitivity are further improved, as compared to BSI CMOS image sensor 400 of FIG. 4, since a boundary 550 between dielectric layer 519 and N-type photodiode implants 516 is substantially flat, and a boundary 552 between dielectric layer 519 and composite grid 503 is also substantially flat, since PDP mask 504 is formed entirely within dielectric layer 519.

As with BSI CMOS image sensor 400, as compared to the prior art BSC CMOS image sensor 300 of FIG. 3, pixel quantum efficiency (QE) and PDP sensitivity of BSI CMOS image sensor 500 are improved because PDP mask 504 is removed from composite grid 503 and therefore does not interfere with light interacting with side edges of the composite grid components for the pixel's light entrance area. Further, since all filters 506, 508, and 520 are the same size, fabrication of BSC CMOS image sensor 500 is simplified as compared to fabrication of prior art BSC CMOS image sensor 300.

Figures 6, 7:
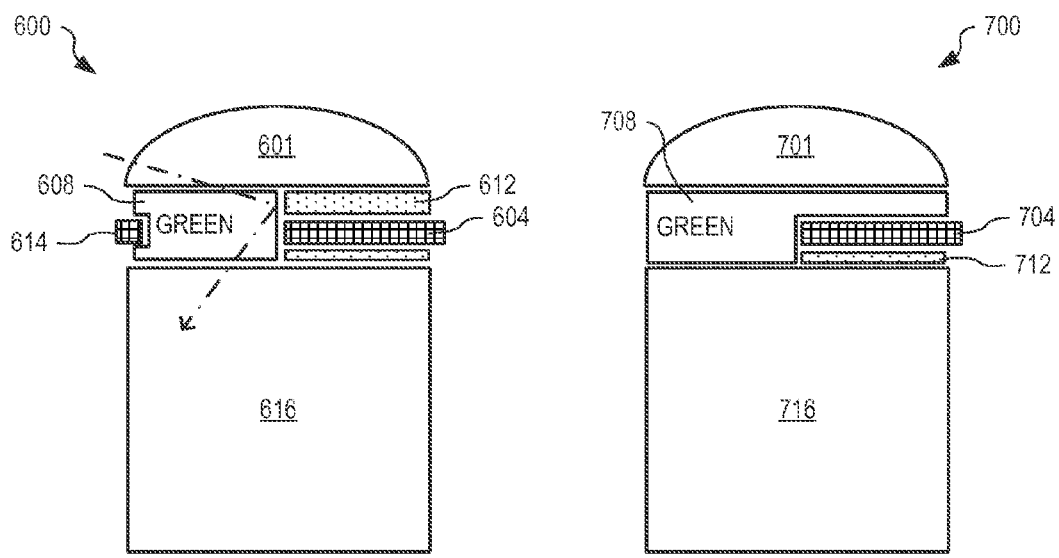
FIG. 6 shows a first PDP structure having a composite grid formed of oxide, a green filter, and a metal grid forming PDP mask that is covered by oxide.
FIG. 7 shows a second PDP structure having a composite grid formed of oxide, a green filter, and a metal grid forming PDP mask, where the green filter extends over the PDP mask.

FIG. 6 shows a first PDP structure 600 having a composite grid formed of oxide 612, a green filter 608, and a metal grid 614 forming PDP mask 604 that is covered by oxide 612. This composite grid is between a lens 601 and a photodiode 616. Fabrication of the composite grid requires that the oxide layer and metal grid layer are etched with one mask. Thus, oxide 612 is formed above PDP mask 604 as shown in structure 600 of FIG. 6. First PDP structure 600 is similar to prior art PDP 302 of FIG. 3, where green filter 604 is reduced in size as compared to other filters of BSI CMOS image sensor 300. FIG. 7 shows a second PDP structure 700 having a composite grid formed of oxide 712, a green filter 708, and a metal grid forming PDP mask 704 where green filter 704 extends the full width of photodiode 716 over PDP mask 704 and there is no oxide layer formed over PDP mask 704.

Figure 8:
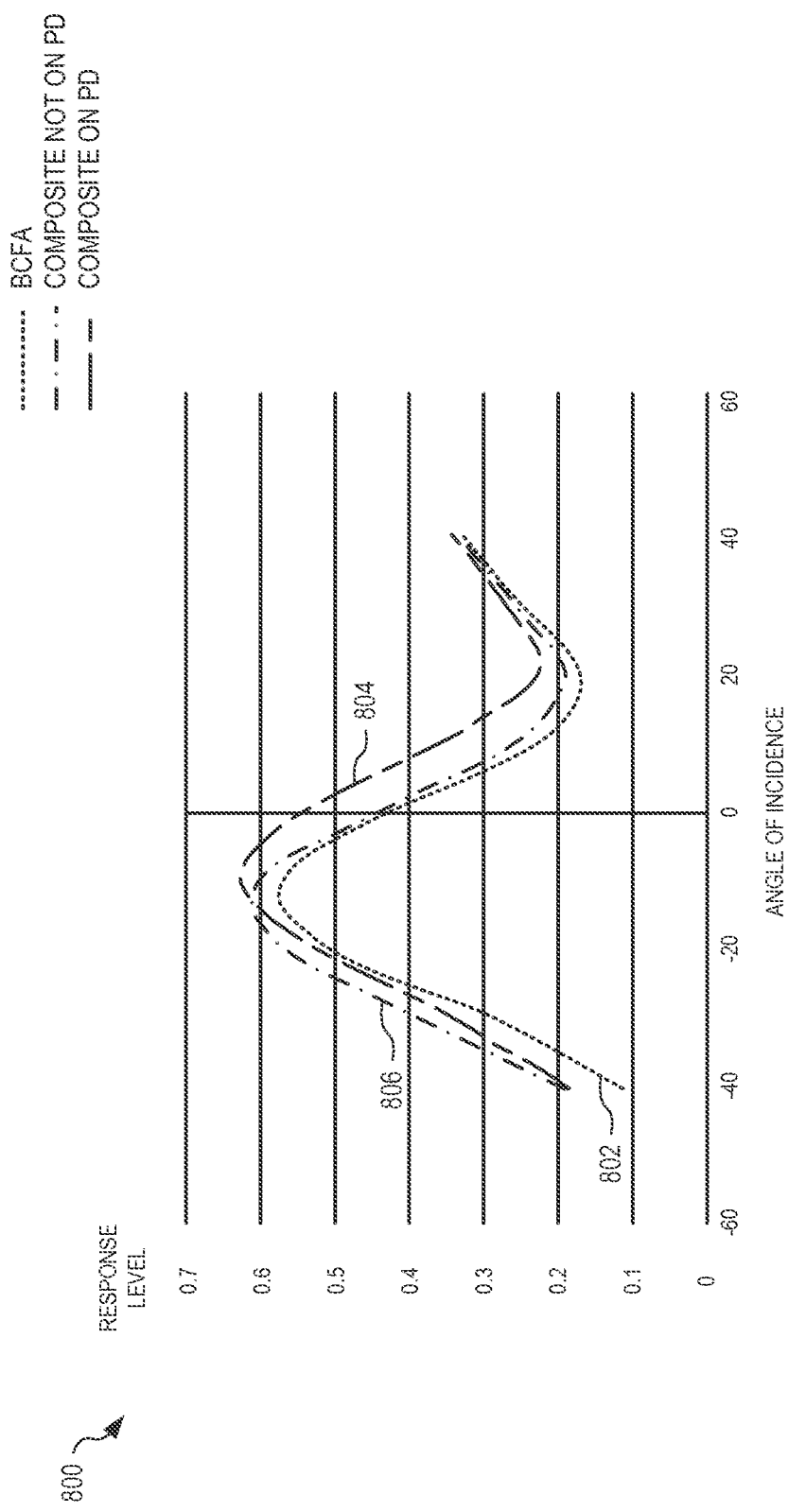
FIG. 8 is a graph showing phase detection results from simulation of each of the PDP structures of FIGS. 6 and 7 using 400 nm-650 nm white light.

FIG. 8 is a graph 800 showing phase detection results from simulation of each of PDP structures 600 and 700 of FIGS. 7 and 8, respectively, using 400 nm-650 nm white light.

On graph 800, line 802 represents response level for a BCFA with a PDP mask. As shown in graph 800, the ratios of max/center for line 802 are:

$$0.575/0.427=1.34$$

where PD signal/Normal G=0.31
where PD signal represent the signal level of a pixel with PDP mask and Normal G represent the signal level of a pixel without PDP mask and with a green color filter/

On graph 800, line 804 represents response level for structure 600 of FIG. 6 (composite on PD). As shown in graph 800, the ratios of max/center for line 804 are 0.628/0.547=1.14 where PD signal/Normal G=0.38

On graph 800, line 806 represents response level for structure 700 of FIG. 7 (composite not on PD). As shown in graph 800, the ratios of max/center for line 806 are 0.61/0.44=1.38 where PD signal/Normal G=0.31

As shown, by combining PDP mask 504 with W filled DTI structure 518(2) such that composite grid 503 (with metal grid 514 and oxide grid 512 and BCFA) is not disrupted by the PDP mask, PDP 502 has higher QE and sensitivity as compared to prior art PDP 302 of FIG. 3.

As shown in graph 800 of FIG. 8, comparing "composite on PD" line 804 with BCFA line 802 shows that phase detection ability of structure 600 is weak. By removing the oxide above the metal, as shown in structure 700 of FIG. 7 where filter 708 extends over mask 704, the phase detection ability of structure 700 is improved back to 1.36, as indicated when "composite not on PD" line 806 is compared with BCFA line 802.

By forming PDP mask 504 with DTI 518, manufacturing of BSI CMOS image sensor 500 is simplified, since composite grid 503 is formed with a single mask, and QE of PDP 502 is improved as compared to PDP 302 of BSI CMOS image sensor 300, FIG. 3.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A back side illuminated (BSI) complementary metal oxide semiconductor (CMOS) image sensor having an array of pixels that include a phase detecting pixel (PDP), a composite grid formed of a buried color filter array and composite metal/oxide grid, and a photodiode implant corresponding to the PDP, the BSI CMOS image sensor comprising:
   a PDP mask fabricated concurrently with a deep trench isolation (DTI) structure proximate the PDP and positioned to mask at least part of the photodiode implant;
   wherein the PDP mask is fabricated of the same material as the DTI structure and is positioned between the composite grid and the photodiode implant.

2. The BSI CMOS image sensor of claim 1, wherein the PDP mask and the DTI structure are continuous.

3. The BSI CMOS image sensor of claim 1, wherein quantum efficiency (QE) and sensitivity of the PDP are improved as compared to a phase detecting pixel having a mask formed with a metal grid of a composite grid.

4. The BSI CMOS image sensor of claim 1, wherein the size of the color filter corresponding to the PDP is substantially the same as the size of a color filter corresponding to other of the pixels.

5. The BSI CMOS image sensor of claim 4, wherein the PDP mask is positioned within a dielectric layer formed between the composite grid and the photodiode implant such that a boundary formed between the dielectric layer and the photodiode implant is substantially flat.

6. The BSI CMOS image sensor of claim 1, wherein the PDP mask is positioned within a dielectric layer formed between the composite grid and the photodiode implant such that a boundary formed between the dielectric layer and the composite grid is substantially flat.

7. The BSI CMOS image sensor of claim 1, wherein the PDP mask and DTI structure are formed of metal.

8. The BSI CMOS image sensor of claim 1, wherein the PDP mask and DTI structure are formed of tungsten.

9. A method for manufacturing a back side illuminated (BSI) complementary metal oxide semiconductor (CMOS) image sensor of the type having an array of pixels that include a phase detecting pixel (PDP), comprising the steps of:
   fabricating, for the PDP, a PDP mask in conjunction with a deep trench isolation (DTI) structure proximate the PDP, the PDP mask and the DTI structure being formed of the same continuous material;
   wherein the PDP mask is positioned entirely between (a) a composite grid having a buried color filter array and composite metal/oxide grid and (b) a photodiode implant corresponding to the PDP.

10. The method of claim 9, the step of fabricating comprising fabricating the PDP mask and the DTI structure to be continuous.

11. The method of claim 9, further comprising fabricating the PDP mask to be entirely within a dielectric layer of the BSI CMOS image sensor.

12. A method for improving phase detection capability of a phase detecting pixel (PDP) in a back side illuminated (BSI) complementary metal oxide semiconductor (CMOS) image sensor, comprising the steps of:
   fabricating a PDP mask of the PDP concurrently with, and of the same material as, deep trench insulation structures of the BSI CMOS image sensor such that the PDP mask is positioned between a composite grid and a photodiode implant of the BSI CMOS image sensor;
   wherein the position of the PDP mask improves the quantum efficiency (QE) and sensitivity of the PDP.

* * * * *